(12) United States Patent
Shimoyasu et al.

(10) Patent No.: US 11,239,020 B2
(45) Date of Patent: Feb. 1, 2022

(54) MULTILAYER COIL COMPONENT

(71) Applicant: TDK CORPORATION, Tokyo (JP)

(72) Inventors: Masashi Shimoyasu, Tokyo (JP);
Shinichi Sato, Tokyo (JP); Seiichi Nakagawa, Tokyo (JP); Mamoru Kawauchi, Tokyo (JP); Shigetoshi Kinouchi, Yurihonjo (JP); Mitsuru Ito, Yurihonjo (JP)

(73) Assignee: TDK CORPORATION, Tokyo (JP)

( * ) Notice: Subject to any disclaimer, the term of this patent is extended or adjusted under 35 U.S.C. 154(b) by 39 days.

(21) Appl. No.: 16/789,893

(22) Filed: Feb. 13, 2020

(65) Prior Publication Data
US 2020/0185144 A1 Jun. 11, 2020

Related U.S. Application Data

(63) Continuation of application No. 15/598,606, filed on May 18, 2017, now Pat. No. 10,643,781.

(30) Foreign Application Priority Data

| May 30, 2016 | (JP) | 2016-107490 |
| May 30, 2016 | (JP) | 2016-107491 |
| May 30, 2016 | (JP) | 2016-107493 |

(51) Int. Cl.
H01F 5/00 (2006.01)
H01F 27/28 (2006.01)
(Continued)

(52) U.S. Cl.
CPC ..... *H01F 27/2804* (2013.01); *H01F 17/0013* (2013.01); *H01F 27/29* (2013.01);
(Continued)

(58) Field of Classification Search
USPC .................................. 336/200, 232, 192, 83
See application file for complete search history.

(56) References Cited

U.S. PATENT DOCUMENTS

| 2011/0007449 A1 | 1/2011 | Seo et al. |
| 2013/0242457 A1 | 9/2013 | Lee et al. |

(Continued)

FOREIGN PATENT DOCUMENTS

| JP | H06-029144 A | 2/1994 |
| JP | H10-022170 A | 1/1998 |

(Continued)

OTHER PUBLICATIONS

Mar. 20, 2019 Office Action issued in U.S. Appl. No. 15/598,606.

(Continued)

*Primary Examiner* — Shawki S Ismail
*Assistant Examiner* — Kazi S Hossain
(74) *Attorney, Agent, or Firm* — Oliff PLC

(57) ABSTRACT

A multilayer coil component includes an element body, a coil disposed in the element body, and an external electrode disposed in the element body and electrically connected to the coil. The element body includes a principal surface that is a mounting surface, and an end surface positioned adjacent to the principal surface and extending in a direction crossing to the principal surface. The external electrode includes an underlying metal layer and a conductive resin layer. The underlying metal layer is formed on the principal surface and the end surface. The conductive resin layer is formed to cover the underlying metal layer. A thickness of the conductive resin layer at an end positioned above the principal surface of the underlying metal layer is equal to or greater than 50% of a maximum thickness of a portion positioned above the principal surface of the conductive resin layer.

3 Claims, 8 Drawing Sheets

(51) Int. Cl.
  *H01F 17/00*    (2006.01)
  *H01F 27/29*    (2006.01)
  *H01F 27/32*    (2006.01)

(52) U.S. Cl.
  CPC ......... *H01F 27/292* (2013.01); *H01F 27/324* (2013.01); *H01F 2027/2809* (2013.01)

(56) References Cited

U.S. PATENT DOCUMENTS

| | | | |
|---|---|---|---|
| 2014/0192453 A1 | 7/2014 | Hong et al. | |
| 2016/0027583 A1 | 1/2016 | Ahn et al. | |
| 2016/0042857 A1* | 2/2016 | Chun .................... | H01F 27/292 336/200 |
| 2016/0126004 A1* | 5/2016 | Yang .................... | H01F 27/292 336/90 |
| 2016/0172108 A1* | 6/2016 | Ikeda .................. | H01G 4/2325 361/301.4 |
| 2016/0225517 A1 | 8/2016 | Choi | |
| 2017/0345553 A1 | 11/2017 | Shimoyasu et al. | |

FOREIGN PATENT DOCUMENTS

| | | | |
|---|---|---|---|
| JP | H10-284343 | A | 10/1998 |
| JP | 2003-309021 | A | 10/2003 |
| JP | 5172818 | B2 | 3/2013 |
| JP | 2013-161872 | A | 8/2013 |
| JP | 2013-191832 | A | 9/2013 |
| JP | 2015-084435 | A | 4/2015 |
| JP | 2017-216288 | A | 12/2017 |
| JP | 2017-216289 | A | 12/2017 |
| JP | 2017-216290 | A | 12/2017 |
| KR | 20150053-445 | * | 11/2008 |
| KR | 2014-0090466 | A | 7/2014 |
| KR | 2015-0053445 | A | 5/2015 |
| KR | 2016-0012830 | A | 2/2016 |

OTHER PUBLICATIONS

Aug. 8, 2019 Office Action issued in U.S. Appl. No. 15/598,606.
Feb. 18, 2020 Office Action issued in Japanese Patent Application No. P2016-107490.
Feb. 18, 2020 Office Action issued in Japanese Patent Application No. P2016-107493.

* cited by examiner

MULTILAYER COIL COMPONENT

This is a Continuation of application Ser. No. 15/598,606 filed May 18, 2017, which in turn claims priority to Japanese Application No. 2016-107490 filed May 30, 2016, Japanese Application No. 2016-107491 filed May 30, 2016, and Japanese Application No. 2016-107493 filed May 30, 2016. The entire disclosures of the prior applications are hereby incorporated by reference herein their entirety.

TECHNICAL FIELD

The present invention relates to a multilayer coil component.

BACKGROUND

Japanese Patent No. 5172818 discloses an electronic component. This electronic component includes an element body and an external electrode disposed on the element body. The external electrode includes an underlying metal layer and a conductive resin layer. The underlying metal layer is formed on the element body. The conductive resin layer is formed to cover the underlying metal layer.

SUMMARY

In the case where an electric component is a multilayer coil component, a problem described below may occur. A conductive resin layer generally includes metal powders and resin (for example, thermosetting resin). Therefore, a resistance of a conductive resin layer is higher than a resistance of an underlying metal layer including metal. Therefore, when an external electrode includes a conductive resin layer, a DC resistance of a multilayer coil component may increase.

To suppress that a DC resistance of a multilayer coil component increases, it is considered that a thickness of a conductive resin layer is reduced. When the thickness of the conductive resin layer is small, a resistance of the conductive resin layer is low as compared with when the thickness of the conductive resin layer is large. However, when the thickness of the conductive resin layer is small, a stress relaxation effect by the conductive resin layer may be reduced as compared with when the thickness of the conductive resin layer is large.

An object of a first aspect of the present invention is to provide a multilayer coil component with a low DC resistance even when an external electrode includes a conductive resin layer.

An object of a second aspect of the present invention is to provide a multilayer coil component in which deterioration in a stress relaxation effect by a conductive resin layer is suppressed even if a thickness of the conductive resin layer is small.

A multilayer coil component is expected to suppress degradation of electrical characteristics even in the case where a crack is generated in an element body.

An object of a third aspect of the present invention is to provide a multilayer coil component in which degradation of electrical characteristics is suppressed even in the case where a crack is generated in an element body.

A multilayer coil component according to the first aspect includes an element body, a coil disposed in the element body, an external electrode disposed on the element body, and a connection conductor disposed in the element body. The connection conductor includes one end connected to the coil and another end connected to the external electrode. The element body includes a principal surface that is a mounting surface and an end surface. The end surface is positioned adjacent to the principal surface and extends in a direction crossing to the principal surface. The external electrode includes a underlying metal layer and a conductive resin layer. The underlying metal layer is formed on the principal surface and the end surface. The conductive resin layer is formed to cover the underlying metal layer. The other end of the connection conductor is exposed at the end surface and connected to the underlying metal layer. When viewed from a direction orthogonal to the end surface, a position where the other end of the connection conductor on the end surface is exposed at the end surface differs from a position where a thickness of a portion positioned above the end surface of the conductive resin layer is maximum.

As a result of research and study by inventors of the present invention, matters described below have been revealed. An underlying metal layer generally includes a sintered metal layer. The sintered metal layer is a layer formed by sintering metal components (metal powders) included in a conductive paste. Therefore, the sintered metal layer is hardly formed as a uniform metal layer, and it is difficult to control a shape of the sintered metal layer. The sintered metal layer, for example, sometimes has a shape (such as a mesh shape) including a plurality of openings (through holes).

A conductive resin layer is a layer in which metal powders are dispersed in cured resin. A current path is formed in the conductive resin layer when the metal powders come into contact with each other. It is difficult to control the dispersion state of the metal powders in the resin. Therefore, a position of the current path in the conductive resin layer is not easily controlled.

Accordingly, current paths on the conductive resin layer and the underlying metal layer differ depending on products. In some products, for example, metal powders are formed in lines at a position where a thickness of a portion positioned above an end surface of the conductive resin layer is maximum, and the metal powders and a underlying metal layer having a mesh shape come into contact with each other. Hereinafter, the position where the thickness of the portion positioned above the end surface of the conductive resin layer is maximum is called "the maximum thickness position of the conductive resin layer". In this product, when viewed from a direction orthogonal to an end surface, if a position where another end of a connection conductor on the end surface is exposed and the maximum thickness position of the conductive resin layer coincide, a current flows into the other end of the connection conductor through a current path formed at the maximum thickness position of the conductive resin layer. Therefore, a DC resistance is high. To obtain a product with a low DC resistance, even if a current path is formed at the maximum thickness position of the conductive resin layer, a probability that a current flows in the current path should be reduced.

In a multilayer coil component according to the first aspect, when viewed from the direction orthogonal to an end surface, a position where the other end of the connection conductor is exposed at the end surface and the maximum thickness position of the conductive resin layer are different. Therefore, it is highly possible that a current flows to the other end of the connection conductor through a current path formed at a position other than the maximum thickness position of the conductive resin layer. As a result, the multilayer coil component with a high DC resistance is not easily obtained. In other words, it is possible to lower a DC resistance of the multilayer coil component.

A multilayer coil component according to the second aspect includes an element body, a coil disposed in the element body, and an external electrode disposed on the element body. The external electrode is electrically connected to the coil. The element body includes a principal surface that is a mounting surface and an end surface. The end surface is positioned adjacent to the principal surface and extends in a direction crossing to the principal surface. The external electrode includes an underlying metal layer and a conductive resin layer. The underlying metal layer is formed on the principal surface and the end surface. The conductive resin layer is formed to cover the underlying metal layer. A thickness of the conductive resin layer at an end positioned above the principal surface of the underlying metal layer is equal to or greater than 50% of a maximum thickness of a portion positioned above the principal surface of the conductive resin layer.

As a result of research and study by inventors of the present invention, matters described below have been revealed. For example, when a multilayer coil component is mounted on an electronic device (for example, a circuit board or an electronic component), an external force acting on the multilayer coil component from the electronic device acts as a stress force on an element body through an external electrode in some cases. The stress force tends to concentrate on an end of the underlying metal layer positioned above the principal surface that is a mounting surface. Therefore, a crack starting from the end of the underlying metal layer may be generated in the element body.

In the multilayer coil component according to the second aspect, the thickness of the conductive resin layer at the end positioned above the principal surface of the underlying metal layer is equal to or greater than 50% of the maximum thickness of the portion positioned above the principal surface of the conductive resin layer. Therefore, even in the case where an external force acts on the multilayer coil component, a stress force does not easily concentrate on the end of the underlying metal layer, and a crack is hardly caused from the end. Therefore, in the multilayer coil component according to the second aspect, even if a thickness of the conductive resin layer is small, deterioration in a stress relaxation effect by the conductive resin layer is suppressed.

A multilayer coil component according to the third aspect includes an element body, a coil disposed in the element body, and an external electrode disposed on the element body. The external electrode is electrically connected to the coil. The element body includes a principal surface that is a mounting surface and an end surface. The end surface is positioned adjacent to the principal surface and extends in a direction crossing to the principal surface. The external electrode includes an underlying metal layer and a conductive resin layer. The underlying metal layer is formed on the principal surface and the end surface. The conductive resin layer is formed to cover the underlying metal layer. An end positioned above the principal surface of the underlying metal layer is positioned on an outer side of the coil when viewed from a direction orthogonal to the principal surface.

In the multilayer coil component according to the third aspect, even in the case where a crack starting from the end of the underlying metal is generated in the element body, the generated crack hardly reaches the coil since the end of the underlying metal layer is positioned on the outer side of the coil when viewed from the direction orthogonal to the principal surface. Therefore, even in the case where a crack is generated in the element body, the crack hardly affects the coil, and degradation of electrical characteristics of the multilayer coil component is suppressed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION

Figure 1:
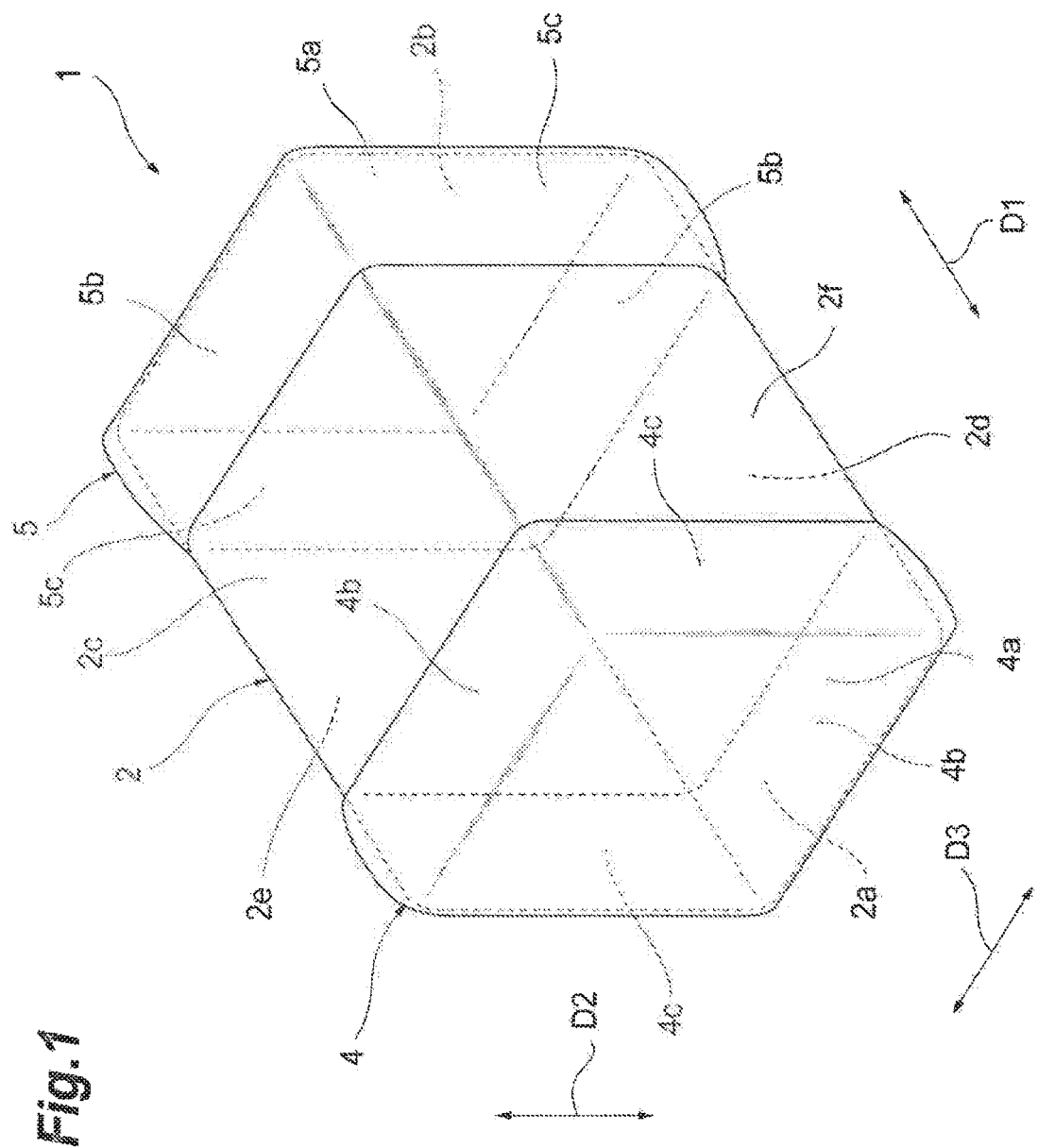
FIG. 1 is a perspective view illustrating a multilayer coil component according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
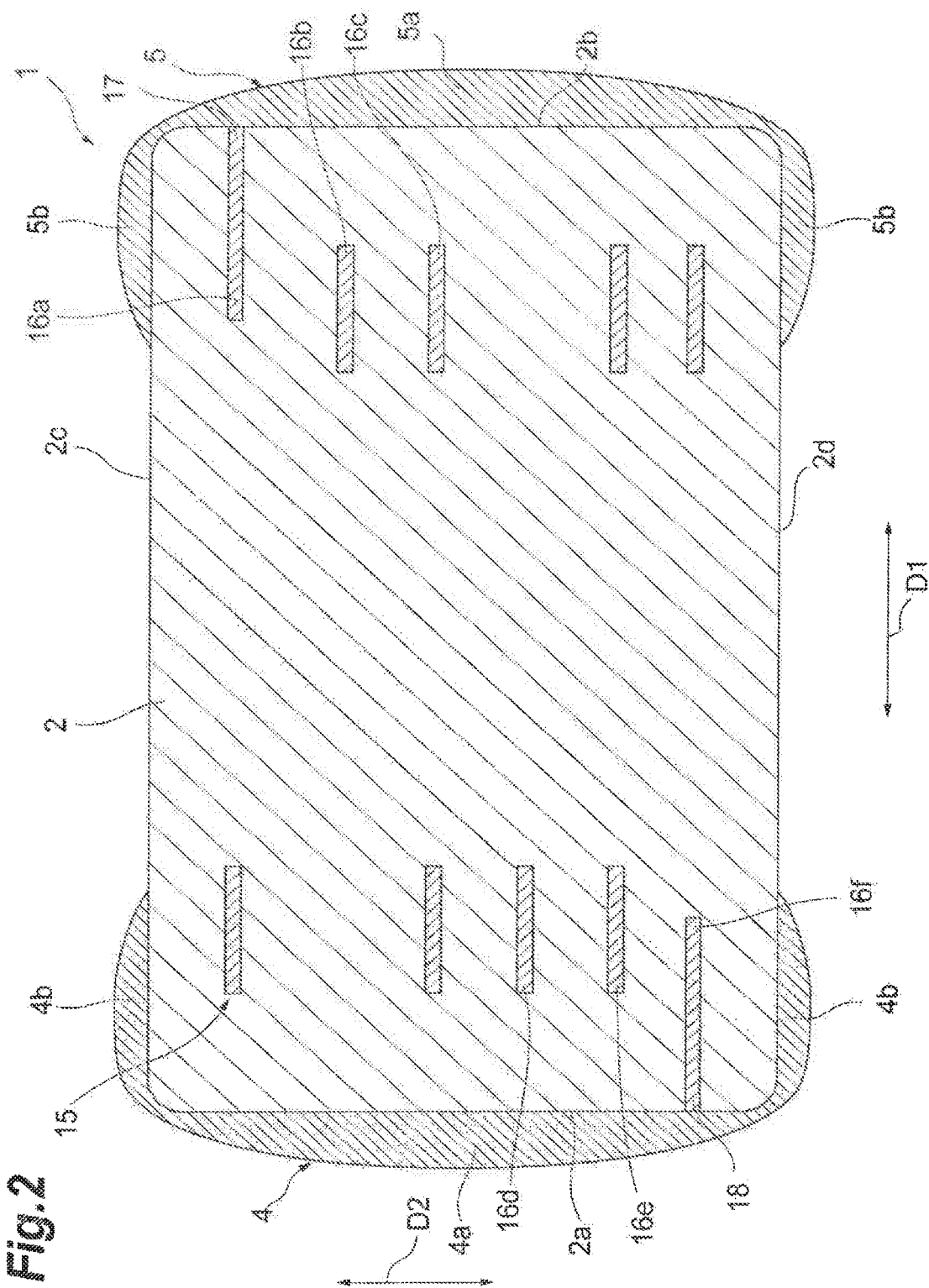
FIG. 2 is a diagram for illustrating a cross-sectional configuration of a multilayer coil component according to the embodiment.
Figure 3:
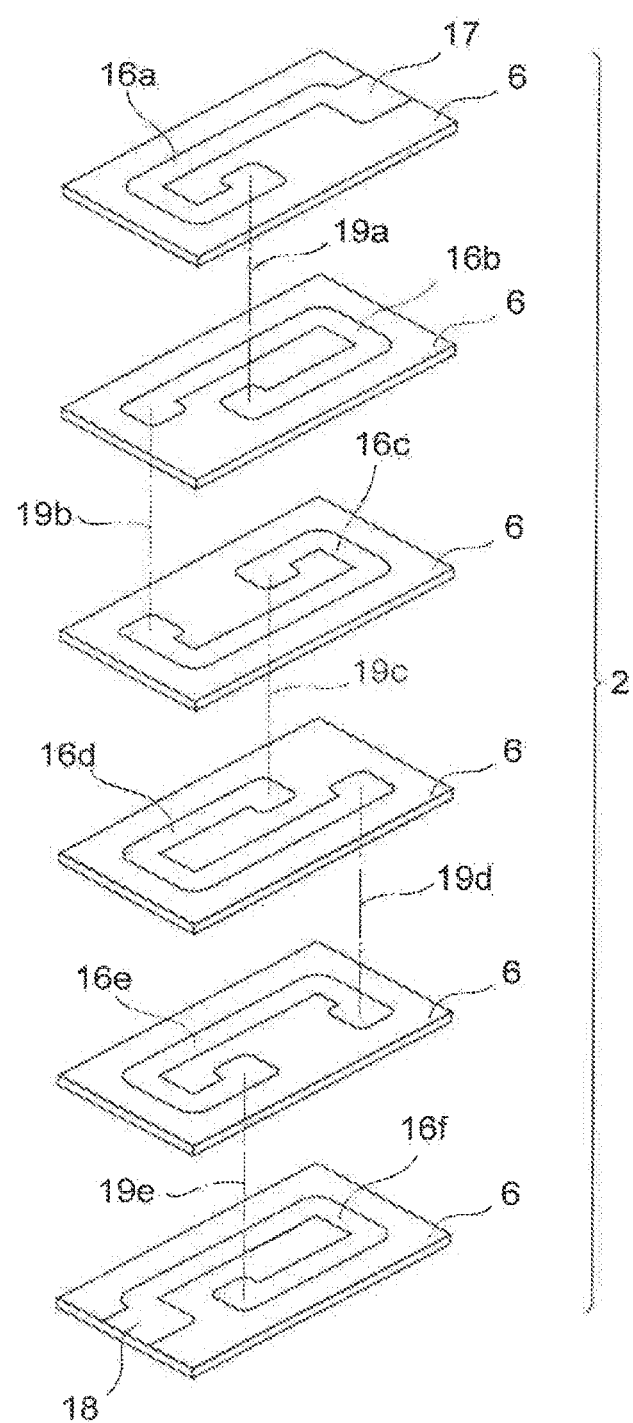
FIG. 3 is a perspective view illustrating a configuration of a coil conductor.

With reference to FIGS. 1 to 3, a configuration of a multilayer coil component 1 according to the embodiment will be described. FIG. 1 is a perspective view illustrating a multilayer coil component according to the embodiment. FIG. 2 is a diagram for illustrating a cross-sectional configuration of a multilayer coil component according to the embodiment. FIG. 3 is a perspective view illustrating a configuration of a coil conductor;

As illustrated in FIG. 1, the multilayer coil component 1 includes an element body 2 and a pair of external electrodes 4 and 5. The rectangular parallelepiped shape includes a shape of a rectangular parallelepiped in which a corner portion and a ridge portion are chamfered and a shape of a rectangular parallelepiped in which a corner portion and a ridge portion are rounded. The external electrode 4 is disposed on one end side of the element body 2. The external electrode 5 is disposed on another end side of the element body 2. The external electrodes 4 and 5 are separated each other. The multilayer coil component 1 is applied to, for example, a bead inductor or a power inductor.

The element body 2 includes a pair of end surfaces 2a and 2b opposing each other, a pair of principal surfaces 2c and 2d opposing each other, and a pair of side surfaces 2e and 2f opposing each other. The end surfaces 2a and 2b are positioned adjacent to the principal surfaces 2c and 2d. The end surfaces 2a and 2b are also positioned adjacent to the side surfaces 2e and 2f. The principal surface 2c or 2d is a mounting surface. For example, when the multilayer coil component 1 is mounted on an electronic device which is not illustrated (for example, a circuit board or an electronic component), the mounting surface is a surface opposing the electronic device.

In the embodiment, a direction in which the end surfaces 2a and 2b oppose each other (a first direction D1) is a length direction of the element body 2. A direction in which the principal surfaces 2c and 2d oppose each other (a second direction D2) is a height direction of the element body 2. A direction in which the side surfaces 2e and 2f oppose each other (a third direction D3) is a width direction of the element body 2. The first direction D1, the second direction D2, and the third direction D3 are mutually orthogonal.

A length in the first direction D1 of the element body 2 is longer than a length in the second direction D2 of the element body 2 and also longer than a length in the third direction D3 of the element body 2. The length in the second direction D2 of the element body 2 and the length in the third direction D3 of the element body 2 are equal. In other words, in the embodiment, the end surfaces 2a and 2b have a square shape, and the principal surfaces 2c and 2d and the side surfaces 2e and 2f have a rectangle shape. The lengths of the first direction D1, the second direction D2, and the third direction D3 of the element body 2 may be equal. The lengths of the second direction D2 and the third direction D3 of the element body 2 may be different.

It is noted herein that the term "equal" does not always mean that values are exactly equal. The values may also be said to be equal in cases where the values have a slight difference within a predetermined range or include a manufacturing error or the like. For example, when a plurality of values fall within the range of ±5% of an average of the plurality of values, the plurality of values may be defined to be equal.

Each of the end surfaces 2a and 2b extends in the second direction D2 to couple the principal surfaces 2c and 2d. Each of the end surfaces 2a and 2b extends in a direction crossing to the principal surfaces 2c and 2d. Each of the end surfaces 2a and 2b also extends in the third direction D3. The principal surfaces 2c and 2d extend in the first direction D1 to couple the end surfaces 2a and 2b. The principal surfaces 2c and 2d also extend in the third direction D3. The side surfaces 2e and 2f extend in the second direction D2 to couple the principal surfaces 2c and 2d. The side surfaces 2e and 2f extend in the first direction D1.

The element body 2 is constituted of a plurality of insulator layers 6 (refer to FIG. 3) laminated. Each of the insulator layers 6 is laminated in the direction in which the principal surfaces 2c and 2d oppose each other. A lamination direction of each insulator layer 6 coincides with the direction in which the principal surfaces 2c and 2d oppose each other. The direction in which the principal surfaces 2c and 2d oppose each other is also called "the lamination direction". Each of the insulator layers 6 has a substantially rectangular shape. In the element body 2 in practice, each of the insulator layers 6 is integrated in such a manner that a boundary between the insulator layers 6 cannot be visually recognized.

Each of the insulator layers 6 includes a sintered ceramic green sheet including a ferrite material (for example, a Ni—Cu—Zn based ferrite material, a Ni—Cu—Zn—Mg based ferrite material, or a Ni—Cu based ferrite material). In other words, the element body 2 includes a ferrite sintered body.

The multilayer coil component 1 includes a coil 15 disposed in the element body 2. As illustrated in FIG. 3, the coil 15 includes a plurality of coil conductors (a plurality of internal conductors) 16a, 16b, 16c, 16d, 16e, and 16f. A plurality of the coil conductors 16a to 16f includes a conductive material (for example, Ag or Pd). A plurality of the coil conductors 16a to 16f is a sintered body of a conductive paste including a conductive material (for example, Ag powders or Pd powders).

The coil conductor 16a includes a connection conductor 17 (conductor). The connection conductor 17 is disposed in the element body 2. The connection conductor 17 is disposed close to the end surface 2b. The connection conductor 17 includes an end exposed at the end surface 2b. The end of the connection conductor 17 is exposed at a position closer to the principal surface 2c than a central region of the end surface 2b when viewed from a direction orthogonal to the end surface 2b. The coil conductor 16a is connected to an external electrode 5 at the end of the connection conductor 17. The coil conductor 16a is electrically connected to the external electrode 5 through the connection conductor 17. In the embodiment, a conductor pattern of the coil conductor 16a and a conductor pattern of the connection conductor 17 are integrally connected.

The coil conductor 16f includes a connection conductor 18 (conductor). The connection conductor 18 is disposed in the element body 2. The connection conductor 18 is disposed close to the end surface 2a. The connection conductor 18 includes an end exposed at the end surface 2a. The end of the connection conductor 18 is exposed at a position closer to the principal surface 2d than a central region of the end surface 2a when viewed from a direction orthogonal to the end surface 2a. The coil conductor 16f is connected to the external electrode 4 at the end of the connection conductor 18. The coil conductor 16f is electrically connected to the external electrode 4 through the connection conductor 18. In the embodiment, a conductor pattern of the coil conductor 16f and a conductor pattern of the connection conductor 18 are integrally connected.

A plurality of coil conductors 16a to 16f is juxtaposed in the lamination direction of the insulator layer 6 in the element body 2. A plurality of the coil conductors 16a to 16f is arranged in an order of the coil conductor 16a, the coil conductor 16b, the coil conductor 16c, the coil conductor 16d, the coil conductor 16e, and the coil conductor 16f from a side near the outermost layer. In the embodiment, the coil 15 includes a portion other than the connection conductor 17 in the coil conductor 16a, a plurality of the coil conductors 16b to 16d, and a portion other than the connection conductor 18 in the coil conductor 16f.

Ends of the coil conductors 16a to 16f are connected each other by through-hole conductors 19a to 19e. The coil conductors 16a to 16f are mutually electrically connected by the through-hole conductors 19a to 19e. The coil 15 includes the coil conductors 16a to 16f electrically connected to each other. Each of the through-hole conductors 19a to 19e includes a conductive material (for example, Ag or Pd). As with a plurality of the coil conductors 16a to 16f, each of the through-hole conductors 19a to 19e is a sintered body of a conducive paste including a conductive material (for example, Ag powders or Pd powders).

The external electrode 4 is positioned at an end on the end surface 2a side in the element body 2 when viewed in the first direction D1. The external electrode 4 includes an electrode portion 4a positioned on the end surface 2a, an electrode portion 4b positioned on the principal surfaces 2c and 2d, and an electrode portion 4c positioned on the side surfaces 2e and 2f. The external electrode 4 is formed on the five surfaces 2a, 2c, 2d, 2e, and 2f.

The electrode portions 4a, 4b, and 4c adjacent to each other are connected on a ridge line portion of the element body 2. The electrode portions 4a, 4b, and 4c are mutually electrically connected. The electrode portions 4a and 4b are connected on a ridge line portion between the end surface 2a and each of the principal surfaces 2c and 2d. The electrode portions 4a and 4c are connected on a ridge line portion between the end surface 2a and each of the side surfaces 2e and 2f.

The electrode portion 4a is disposed to cover the entire end exposed at the end surface 2a of the connection conductor 18. The connection conductor 18 is directly connected to the external electrode 4. The connection conductor 18 connects the coil conductor 16a (one end of the coil 15) and the electrode portion 4a. The coil 15 is electrically connected to the external electrode 4.

The external electrode 5 is positioned at an end on the end surface 2b side in the element body 2 when viewed in the first direction D1. The external electrode 5 includes an electrode portion 5a positioned on the end surface 2b, an electrode portion 5b positioned on the principal surfaces 2c and 2d, and an electrode portion 5c positioned on the side surfaces 2e and 2f. The external electrode 5 is formed on the five surfaces 2b, 2c, 2d, 2e, and 2f.

The electrode portions 5a, 5b, and 5c adjacent to each other are connected on a ridge line portion of the element body 2. The electrode portions 5a, 5b, and 5c are mutually electrically connected. The electrode portions 5a and 5b are connected on a ridge line portion between the end surface 2b and each of the principal surfaces 2c and 2d. The electrode portions 5a and 5c are connected on a ridge line portion between the end surface 2b and each of the side surfaces 2e, and 2f.

The electrode portion 5a is disposed to cover the entire end exposed at the end surface 2b of the connection conductor 17. The connection conductor 17 is directly connected to the external electrode 5. The connection conductor 17 connects the coil conductor 16f (another end of the coil 15) and the electrode portion 5a. The coil 15 is electrically connected to the external electrode 5.

Figure 4:
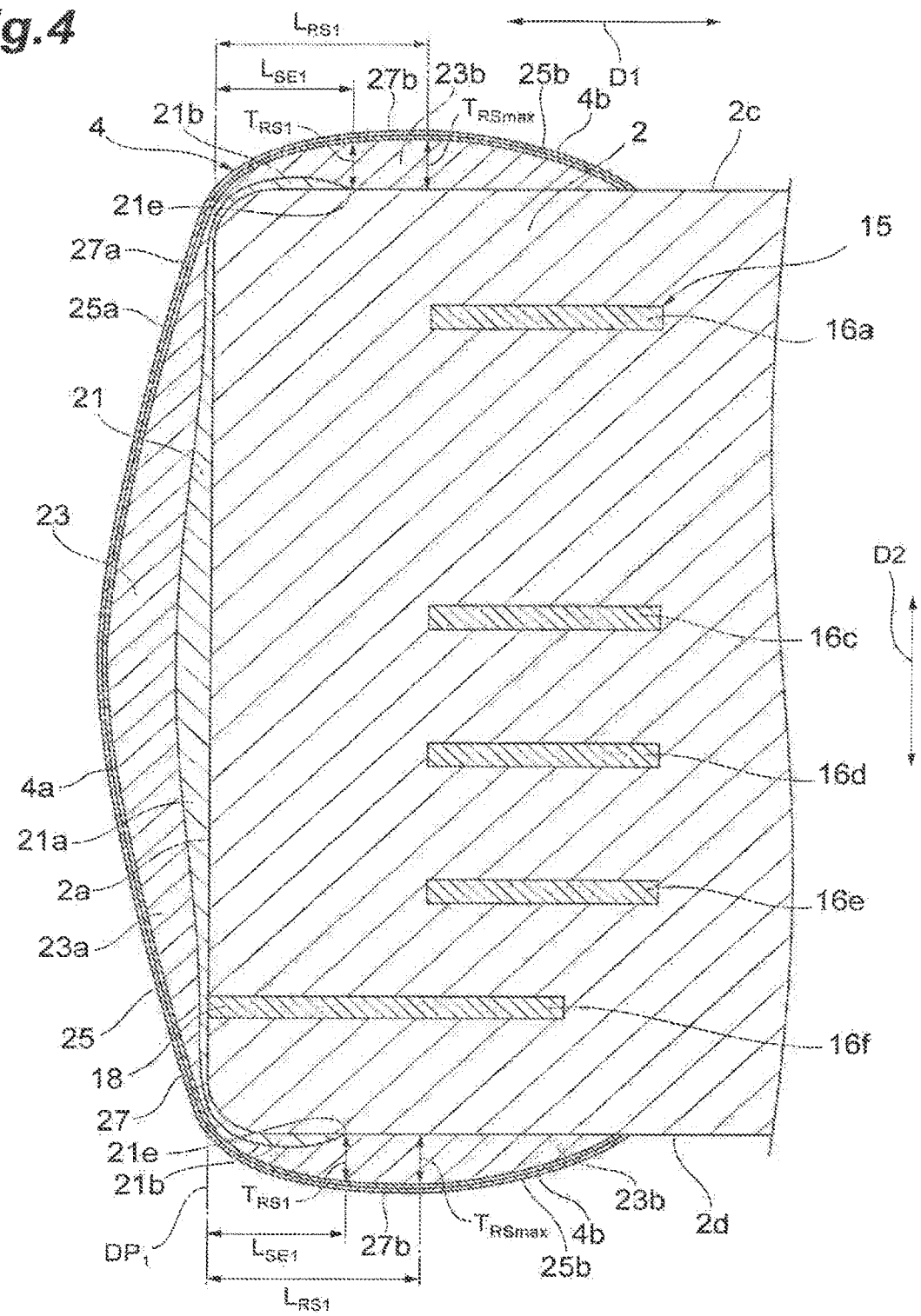
FIG. 4 is a diagram for illustrating a cross-sectional configuration of an external electrode.
Figure 5:
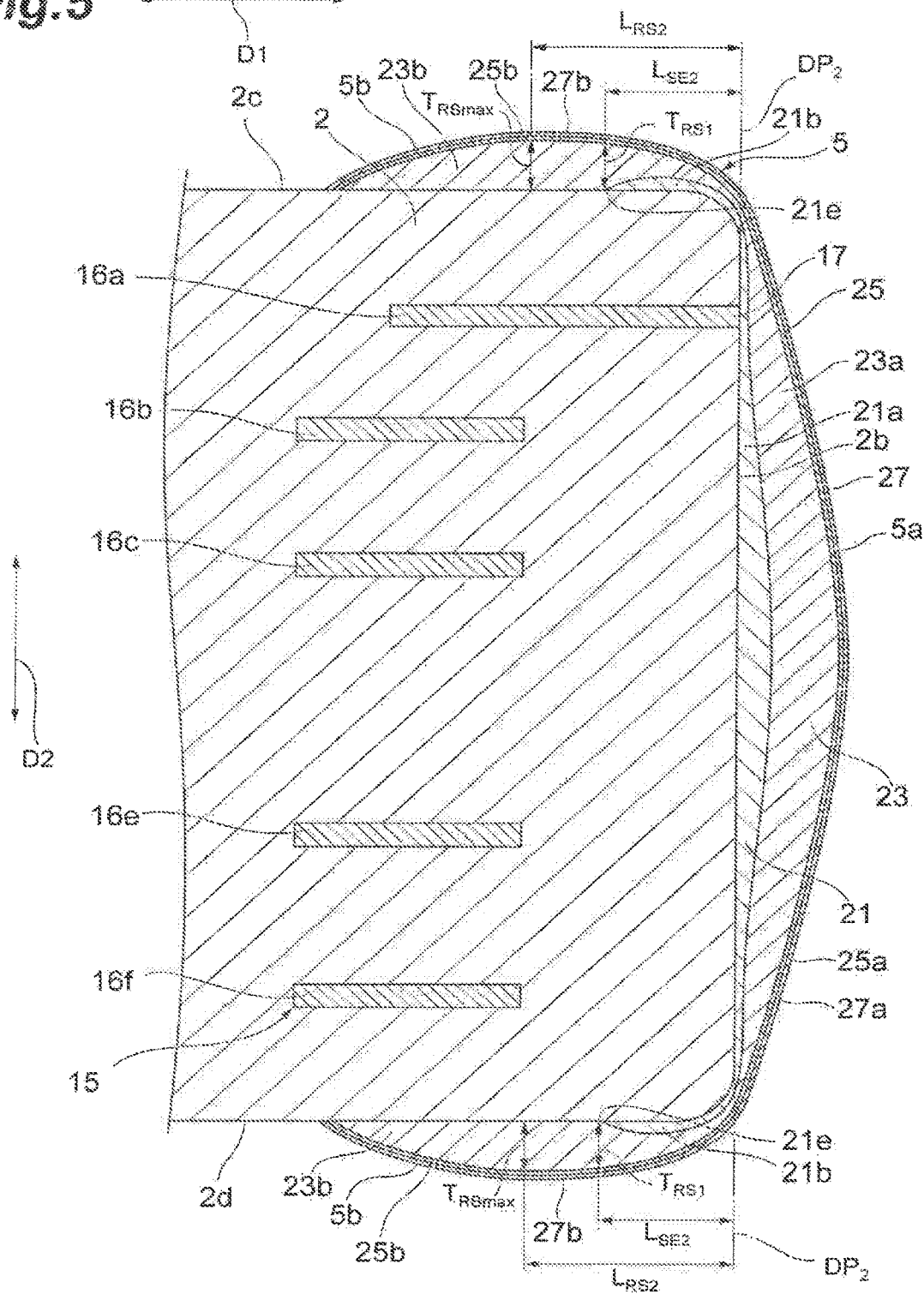
FIG. 5 is a diagram for illustrating a cross-sectional configuration of an external electrode.

As illustrated in FIGS. 4 and 5, each of the external electrodes 4 and 5 includes a first electrode layer 21, a second electrode layer 23, a third electrode layer 25, and a fourth electrode layer 27. Each of the electrode portions 4a, 4b, and 4c includes the first electrode layer 21, the second electrode layer 23, the third electrode layer 25, and the fourth electrode layer 27. Each of the electrode portions 5a, 5b, and 5c includes the first electrode layer 21, the second electrode layer 23, the third electrode layer 25, and the fourth electrode layer 27. The fourth electrode layer 27 includes an outermost layer of the external electrodes 4 and 5. FIGS. 4 and 5 are diagrams for illustrating a cross-sectional configuration of an external electrode.

The first electrode layer 21 is formed by applying and sintering a conductive paste on a surface of the element body 2. The first electrode layer 21 is a sintered metal layer formed by sintering metal components (metal powders) included in a conductive paste. In other words, the first electrode layer 21 is a sintered metal layer formed on the element body 2. In the embodiment, the first electrode layer 21 is a sintered metal layer including Ag. The first electrode layer 21 may be a sintered metal layer including Pd. The first electrode layer 21 includes Ag or Pd. In the conductive paste, for example, a glass component, an organic binder, and an organic solvent are mixed in powders including Ag or Pd.

The second electrode layer 23 is formed by curing a conductive resin applied on the first electrode layer 21. The second electrode layer 23 is formed to cover a whole of the first electrode layer 21. The first electrode layer 21 is an underlying metal layer to form the second electrode layer 23. The second electrode layer 23 is a conductive resin layer formed on the first electrode layer 21. For example, a thermosetting resin, metal powders, and an organic solvent are mixed in the conductive resin. For example, Ag powders are used in the metal powders. For example, a phenol resin, an acrylic resin, a silicone resin, an epoxy resin, or a polyimide resin is used in the thermosetting resin.

The third electrode layer 25 is formed by a plating method on the second electrode layer 23. In the embodiment, the third electrode layer 25 is a Ni plated layer formed by Ni plating on the second electrode layer 23. The third electrode layer 25 may be a Sn plated layer, a Cu plated layer, or an Au plated layer. The third electrode layer 25 includes Ni, Sn, Cu, or Au.

The fourth electrode layer 27 is formed by a plating method on the third electrode layer 25. In the embodiment, the fourth electrode layer 27 is a Sn plated layer formed by Sn plating on the third electrode layer 25. The fourth electrode layer 27 may be a Cu plated layer or an Au plated layer. The fourth electrode layer 27 includes Sn, Cu, or Au. The third electrode layer 25 and the fourth electrode layer 27 constitute a plated layer formed on the second electrode layer 23. In the embodiment, the plated layer formed on the second electrode layer 23 has a two-layer structure.

Each first electrode layer 21 includes a first portion 21a positioned above the end surfaces 2a and 2b. The first portion 21a corresponds to the first electrode layer 21 included in the electrode portions 4a and 5a. An average thickness of the first portion 21a is, for example, 10 to 30 μm. A thickness of the first portion 21a is, as illustrated in FIGS. 4 and 5, reduced at both ends in the second direction D2 and increased in an intermediate portion between the both ends. Each second electrode layer 23 includes a first portion 23a positioned above the end surfaces 2a and 2b. The first portion 23a corresponds to the second electrode layer 23 included in the electrode portions 4a and 5a. An average thickness of the first portion 23a is, for example, 30 to 50 μm. A thickness of the first portion 23a is, as illustrated in FIG. 4, reduced at both ends in the second direction D2 and increased in an intermediate portion between the both ends. Each third electrode layer 25 includes a first portion 25a positioned above the end surfaces 2a and 2b. The first portion 25a corresponds to the third electrode layer 25 included in the electrode portions 4a and 5a. An average thickness of the first portion 25a is, for example, 1 to 3 μm. Each fourth electrode layer 27 includes a first portion 27a positioned above the end surfaces 2a and 2b. The first portion 27a corresponds to the fourth electrode layer 27 included in the electrode portions 4a and 5a. An average thickness of the first portion 27a is, for example, 2 to 7 μm. An average thickness of a portion positioned above the end surfaces 2a and 2b of the plated layer (the third and fourth electrode layers 25 and 27) is, for example, 3 to 10 μm. The average thickness of the portion positioned above the end surfaces 2a and 2b of the plated layer is the average thickness of the plated layer included in the electrode portions 4a and 5a.

Each first electrode layer 21 includes a second portion 21b positioned above the principal surfaces 2c and 2d. The second portion 21b corresponds to the first electrode layer 21 included in the electrode portions 4b and 5b. An average thickness of the second portion 21b is, for example, 1 to 2 µm. A thickness of the second portion 21b is, as illustrated in FIGS. 4 and 5, reduced at both ends in the first direction D1 and increased in an intermediate portion between the both ends. Each second electrode layer 23 includes a second portion 23b positioned above the principal surfaces 2c and 2d. The second portion 23b corresponds to the second electrode layer 23 included in the electrode portions 4b and 5b. An average thickness of the second portion 23b is, for example, 10 to 30 µm. A thickness of the second portion 23b is, as illustrated in FIGS. 4 and 5, reduced at both ends in the first direction D1 and increased in an intermediate portion between the both ends. Each third electrode layer 25 includes a second portion 25b positioned above the principal surfaces 2c and 2d. The second portion 25b corresponds to the third electrode layer 25 included in the electrode portions 4b and 5b. An average thickness of the second portion 25b is, for example, 1 to 3 µm. Each fourth electrode layer 27 includes a second portion 27b positioned above the principal surfaces 2c and 2d. The second portion 27b corresponds to the fourth electrode layer 27 included in the electrode portions 4b and 5b. An average thickness of the second portion 27b is, for example, 2 to 7 µm. An average thickness of a portion positioned above the principal surfaces 2c and 2d of the plated layer (the third and fourth electrode layers 25 and 27) is, for example, 3 to 10 µm. The average thickness of the portion positioned above the principal surfaces 2c and 2d of the plated layer is the average thickness of the plated layer included in the electrode portions 4b and 5b. An average thickness of the second electrode layer 23 included in the electrode portions 4b and 5b is equal to or less than 15 times of an average thickness of the first electrode layer 21 included in the electrode portions 4b and 5b. The average thickness of the second electrode layer 23 included in the electrode portions 4b and 5b is equal to or less than 5 times of the average thickness of a plated layer included in the electrode portions 4b and 5b.

The average thickness is calculated, for example, in the following manner.

A sectional view including each of the first portions 21a, 23a, 25a, and 27a of the first electrode layer 21, the second electrode layer 23, the third electrode layer 25, and the fourth electrode layer 27 is obtained. The sectional view is, for example, a sectional view of the first electrode layer 21, the second electrode layer 23, the third electrode layer 25, and the fourth electrode layer 27 in the case where the layers are cut at a plane in parallel with a pair of surfaces (for example a pair of the side surfaces 2e and 2f) opposing each other and positioned at an equal distance from a pair of the surfaces. On the obtained sectional view, each area of the first portions 21a, 23a, 25a, and 27a of the first electrode layer 21, the second electrode layer 23, the third electrode layer 25, and the fourth electrode layer 27 is calculated.

A quotient obtained by dividing an area of the first portion 21a of the first electrode layer 21 by a length of the first portion 21a on the obtained sectional surface indicates an average thickness of the first portion 21a of the first electrode layer 21. A quotient obtained by dividing an area of the first portion 23a of the second electrode layer 23 by a length of the first portion 23a on the obtained sectional surface indicates an average thickness of the first portion 23a of the second electrode layer 23. A quotient obtained by dividing an area of the first portion 25a of the third electrode layer 25 by a length of the first portion 25a on the obtained sectional surface indicates an average thickness of the first portion 25a of the third electrode layer 25. A quotient obtained by dividing an area of the first portion 27a of the fourth electrode layer 27 by a length of the first portion 27a on the obtained sectional surface indicates an average thickness of the first portion 27a of the fourth electrode layer 27.

A sectional view including each of the second portions 21b, 23b, 25b, and 27b of the first electrode layer 21, the second electrode layer 23, the third electrode layer 25, and the fourth electrode layer 27 is obtained. The sectional view is, for example, a sectional view of the first electrode layer 21, the second electrode layer 23, the third electrode layer 25, and the fourth electrode layer 27 in the case where the layers are cut at a plane in parallel with a pair of surfaces (for example a pair of the side surfaces 2e and 2f) opposing each other and positioned at an equal distance from a pair of the surfaces. On the obtained sectional view, each area of the second portions 21b, 23b, 25b, and 27b of the first electrode layer 21, the second electrode layer 23, the third electrode layer 25, and the fourth electrode layer 27 is calculated.

A quotient obtained by dividing an area of the second portion 21b of the first electrode layer 21 by a length of the second portion 21b on the obtained sectional surface indicates an average thickness of the second portion 21b of the first electrode layer 21. A quotient obtained by dividing an area of the second portion 23b of the second electrode layer 23 by a length of the second portion 23b on the obtained sectional surface indicates an average thickness of the second portion 23b of the second electrode layer 23. A quotient obtained by dividing an area of the second portion 25b of the third electrode layer 25 by a length of the second portion 25b on the obtained sectional surface indicates an average thickness of the second portion 25b of the third electrode layer 25. A quotient obtained by dividing an area of the second portion 27b of the fourth electrode layer 27 by a length of the second portion 27b on the obtained sectional surface indicates an average thickness of the second portion 27b of the fourth electrode layer 27.

A plurality of sectional views may be obtained, and each of the quotients for each sectional view may be obtained. In which case, an average value of a plurality of the obtained quotients may be an average thickness.

Next, a relation between the first electrode layers 21 and second electrode layers 23 of the external electrodes 4 and 5 above the principal surfaces 2c and 2d will be described with reference to FIGS. 4 and 5.

Each first electrode layer 21 includes a first end 21e positioned above the principal surfaces 2c and 2d. A thickness $T_{RS1}$ of the second portion 23b of the second electrode layer 23 at a position of the first end 21e is equal to or greater than 50% of a maximum thickness $T_{RSmax}$ of the second portion 23b. In other words, the thickness $T_{RS1}$ of the second electrode layer 23 positioned above the first end 21e of the first electrode layer 21 included in the electrode portions 4b and 5b is equal to or greater than 50% of a maximum thickness $T_{RSmax}$ of the second electrode layer 23 included in the electrode portions 4b and 5b. The maximum thickness $T_{RSmax}$ is, for example, 11 to 40 µm. The thickness $T_{RS1}$ is, for example, 6 to 40 µm. In the embodiment, the maximum thickness $T_{RSmax}$ is 30 µm, and the thickness $T_{RS1}$ is 20 µm. In other words, the thickness $T_{RS1}$ is approximately 67% of the maximum thickness $T_{RSmax}$.

In the electrode portion 4b, the first end 21e of the first electrode layer 21 is positioned closer to the end surface 2a than a position where a thickness of the second portion 23b is the maximum thickness $T_{RSmax}$ when viewed from a direction orthogonal to the principal surfaces 2c and 2d (the second direction D2). In other words, the first end 21e of the first electrode layer 21 included in the electrode portion 4b is positioned closer to the end surface 2a than a position where a thickness of the second electrode layer 23 included in the electrode portion 4b is the maximum thickness $T_{RSmax}$ when viewed from the second direction D2. When a plane including the end surface 2a is set to a reference surface $DP_1$, a length $L_{SE1}$ in the first direction D1 from the reference surface $DP_1$ to the first end 21e is shorter than a length $L_{RS1}$ in the first direction D1 from the reference surface $DP_1$ to a position where a thickness of the second electrode layer 23 included in the electrode portion 4b is the maximum thickness $T_{RSmax}$.

In the electrode portion 5b, the first end 21e of the first electrode layer 21 is positioned closer to the end surface 2b than a position where a thickness of the second portion 23b is the maximum thickness $T_{RSmax}$ when viewed from the second direction D2. In other words, the first end 21e of the first electrode layer 21 included in the electrode portion 5b is positioned closer to the end surface 2b than a position where a thickness of the second electrode layer 23 included in the electrode portion 5b is the maximum thickness $T_{RSmax}$ when viewed from the second direction D2. When a plane including the end surface 2b is set to a reference surface $DP_2$, a length $L_{SE2}$ in the first direction D1 from the reference surface $DP_2$ to the first end 21e is shorter than a length $L_{RS2}$ in the first direction D1 from the reference surface $DP_2$ to a position where a thickness of the second electrode layer 23 included in the electrode portion 5b is the maximum thickness $T_{RSmax}$.

The length $L_{SE1}$ is, for example, 80 µm. The length $L_{RS1}$ is, for example, 120 µm. The length $L_{SE2}$ is, for example, 80 µm. The length $L_{RS2}$ is, for example, 120 µm. In the embodiment, the length $L_{SE1}$ and the length $L_{SE2}$ are equal. However, the length $L_{SE1}$ and the length $L_{SE2}$ may be different. In the embodiment, the length $L_{RS1}$ and the length $L_{RS2}$ are equal. However, the length $L_{RS1}$ and the length $L_{RS2}$ may be different.

A relation between the first electrode layers 21 and second electrode layers 23 of the external electrodes 4 and 5 above the side surfaces 2e and 2f will be described next although it is not illustrated.

Each second electrode layer 23 includes a third portion positioned above the side surfaces 2e and 2f. Each first electrode layer 21 includes a second end positioned above the side surfaces 2e and 2f. A thickness of the third portion of the second electrode layer 23 at a position of the second end of the first electrode layer 21 is equal to or greater than 50% of a maximum thickness in the third portion of the second electrode layer 23. In other words, the thickness of the second electrode layer 23 positioned above the second end of the first electrode layer 21 included in the electrode portions 4c and 5c is equal to or greater than 50% of the maximum thickness of the second electrode layer 23 included in the electrode portions 4c and 5c. The thickness of the second electrode layer 23 positioned above the second end of the first electrode layer 21 included in the electrode portions 4c and 5c is equal to the thickness $T_{RS1}$. The maximum thickness of the second electrode layer 23 included in the electrode portions 4c and 5c is equal to the maximum thickness $T_{RSmax}$.

In the electrode portion 4c, the second end of the first electrode layer 21 is positioned closer to the end surface 2a than a position where a thickness of the third portion of the second electrode layer 23 is maximum when viewed from a direction orthogonal to the side surfaces 2e and 2f (the third direction D3). In other words, the second end of the first electrode layer 21 included in the electrode portion 4c is positioned closer to the end surface 2a than the position where the thickness of the second electrode layer 23 included in the electrode portion 4c is maximum when viewed from the third direction D3.

A length in the first direction D1 from the reference surface $DP_1$ to the second end of the first electrode layer 21 included in the electrode portion 4c is equal to the length $L_{SE1}$. A length in the first direction D1 from the reference surface $DP_1$ to the position where the thickness of the second electrode layer 23 included in the electrode portion 4c is maximum is equal to the length $L_{RS1}$. Therefore, the length in the first direction D1 from the reference surface $DP_1$ to the second end of the first electrode layer 21 included in the electrode portion 4c is shorter than the length in the first direction D1 from the reference surface $DP_1$ to the position where the thickness of the second electrode layer 23 included in the electrode portion 4c is maximum.

In the electrode portion 5c, the second end of the first electrode layer 21 is positioned closer to the end surface 2b than a position where a thickness of the third portion of the second electrode layer 23 is maximum when viewed from the third direction D3. In other words, the second end of the first electrode layer 21 included in the electrode portion 5c is positioned closer to the end surface 2b than the position where the thickness of the second electrode layer 23 included in the electrode portion 5c is maximum when viewed from the third direction D3.

A length in the first direction D1 from the reference surface $DP_2$ to the second end of the first electrode layer 21 included in the electrode portion 5c is equal to the length $L_{SE2}$. A length in the first direction D1 from the reference surface $DP_2$ to the position where the thickness of the second electrode layer 23 included in the electrode portion 5c is maximum is equal to the length $L_{RS2}$. Therefore, the length in the first direction D1 from the reference surface $DP_2$ to the second end of the first electrode layer 21 included in the electrode portion 5c is shorter than the length in the first direction D1 from the reference surface $DP_2$ to the position where the thickness of the second electrode layer 23 included in the electrode portion 5c is maximum.

Figure 6:
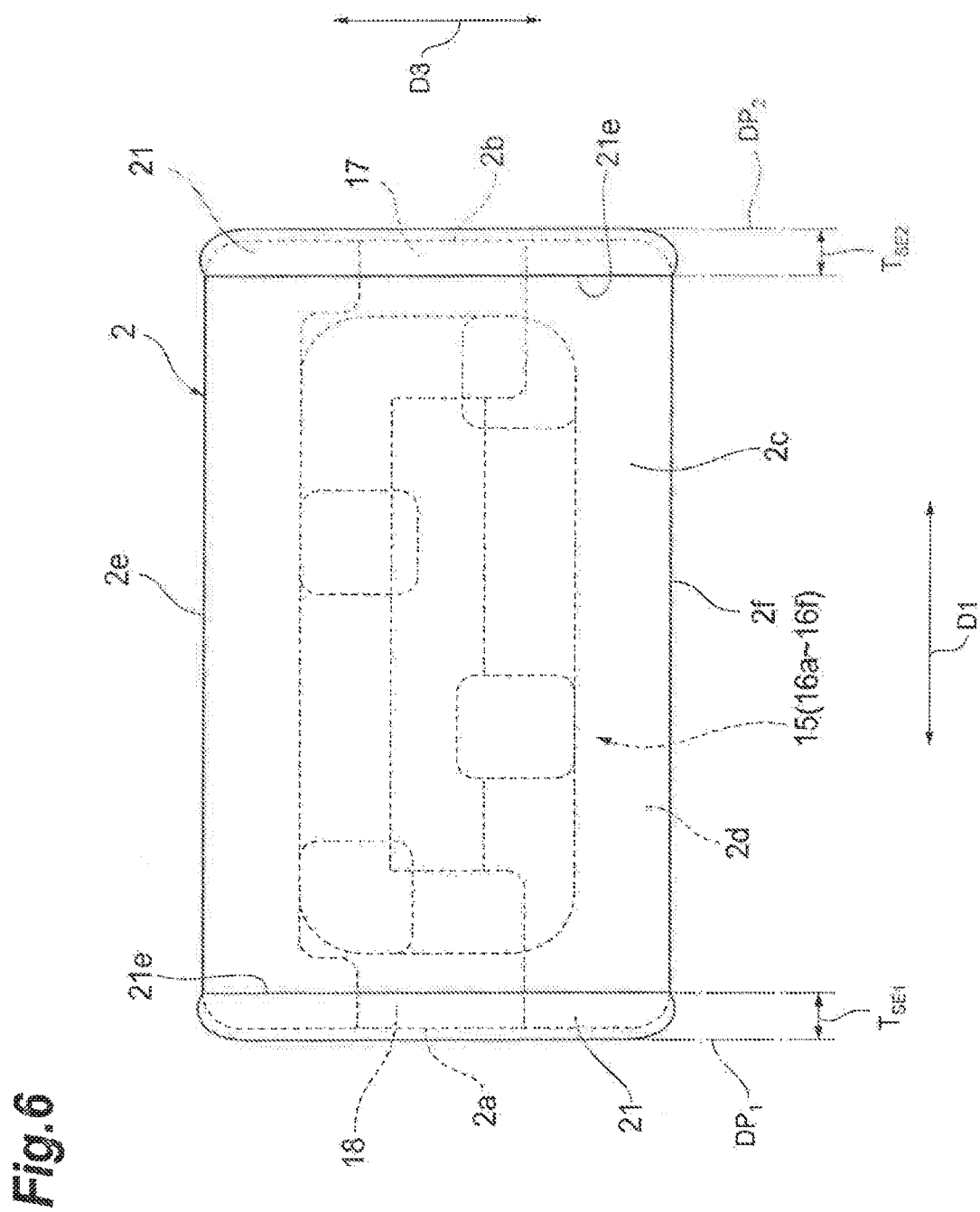
FIG. 6 is a plan view of an element body on which a first electrode layer is formed.

Next, a relation between the coil 15 and the first electrode layer 21 will be described with reference to FIG. 6. FIG. 6 is a plan view of an element body on which a first electrode layer is formed;

As illustrated in FIG. 6, the first end 21e of the first electrode layer 21 (an end of the first electrode layer 21 included in the electrode portions 4b and 5b) is positioned on an outer side of the coil 15 when viewed from the direction orthogonal to the principal surfaces 2c and 2d (the second direction D2). The first end 21e of the first electrode layer 21 corresponds to an end of the first electrode layer 21 included in the electrode portions 4b and 5b. In other words, the first electrode layer 21 included in the electrode portions 4b and 5b does not overlap the coil 15 when viewed from the direction orthogonal to the principal surfaces 2c and 2d. The length $L_{SE1}$ is shorter than a length in the first direction D1 from the reference surface $DP_1$ to the coil 15. The length $L_{SE2}$ is shorter than a length in the first direction D1 from the reference surface $DP_2$ to the coil 15 in the first direction D1. A part of the first electrode layer 21 included in the electrode portions 4b and 5b overlaps the connection conductors 17 and 18 when viewed from the second direction D2.

The second end of the first electrode layer 21 (an end of the first electrode layer 21 included in the electrode portions 4c and 5c) is also positioned on the outer side of the coil 15 when viewed from the third direction D3 (the direction orthogonal to the side surfaces 2e and 2f) although it is not illustrated. In other words, the first electrode layer 21 included in the electrode portions 4c and 5c does not overlap the coil 15 when viewed from the third direction D3. A part of the first electrode layer 21 included in the electrode portions 4c and 5c overlaps the connection conductors 17 and 18 when viewed from the third direction D3.

Figure 7:
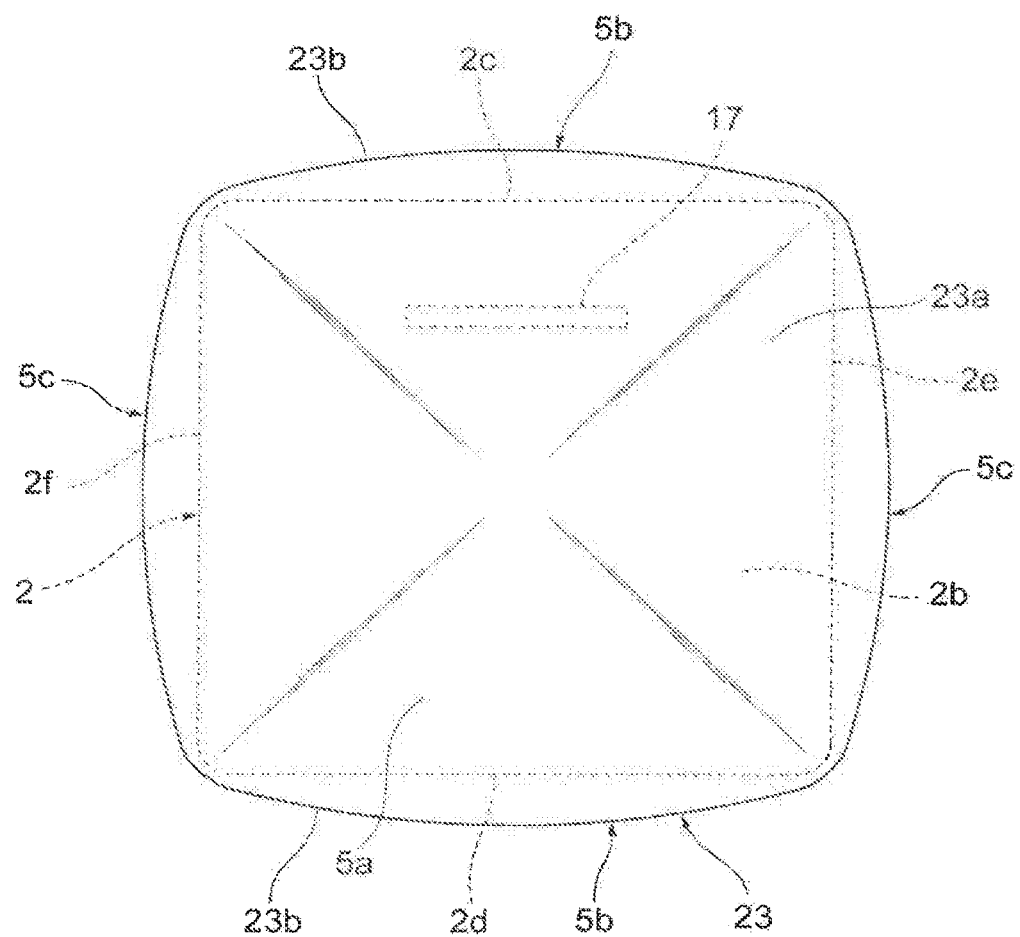
FIG. 7 is a plan view of a second electrode layer included in an electrode portion positioned on an end surface.
Figure 8:
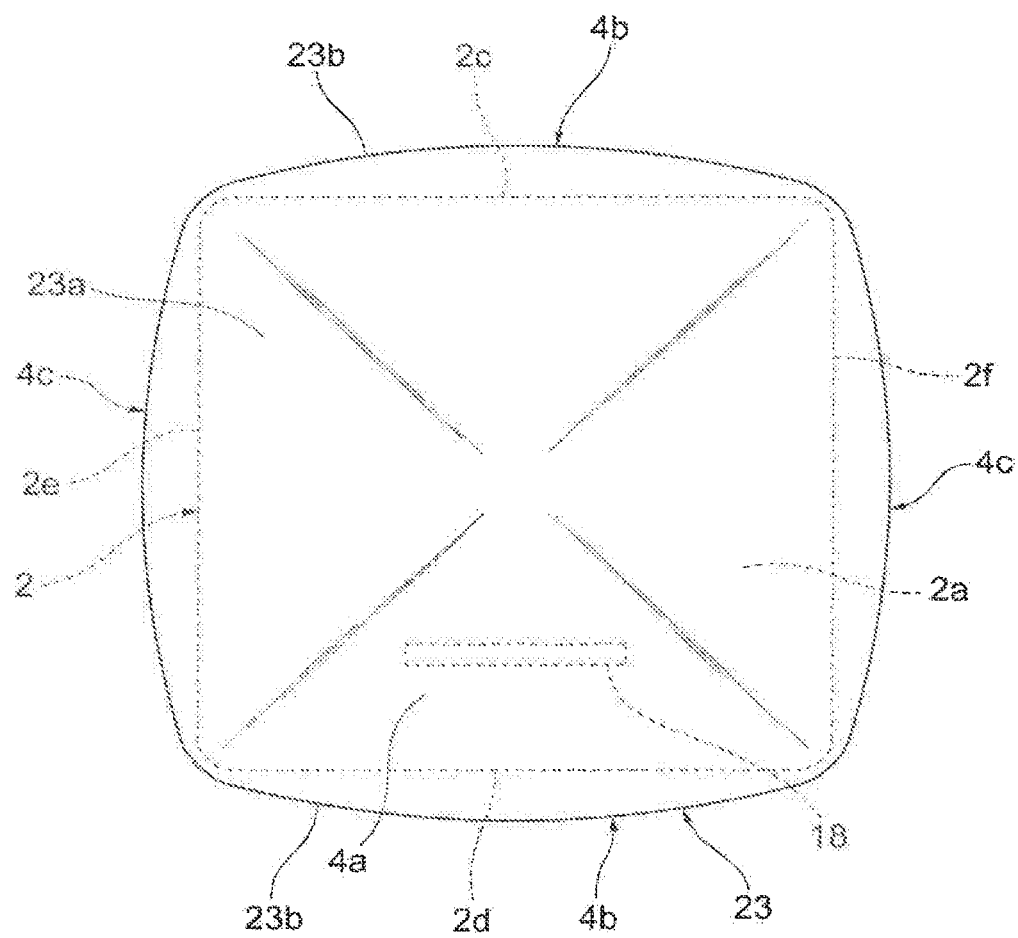
FIG. 8 is a plan view of a second electrode layer included in an electrode portion positioned on an end surface.

Next, a relation between the coil 15 and the first electrode layer 21 will be described with reference to FIGS. 7 and 8. FIGS. 7 and 8 are plan views of a second electrode layer including an electrode portion positioned on an end surface.

As illustrated in FIGS. 4 and 5, the connection conductor 17 includes one end connected to the coil 15 and another end connected to the first electrode layer 21. The other end of the connection conductor 17 is exposed at the end surface 2b. The connection conductor 18 includes one end connected to the coil 15 and another end connected to the first electrode layer 21. The other end of the connection conductor 18 is exposed at the end surface 2a.

When the second electrode layer 23 is formed, a conductive resin is generally applied by a dipping method. In which case, a thickness of the second electrode layer 23 included in the electrode portions 4a and 5a is maximized at a position corresponding to the central region of the end surfaces 2a and 2b and reduced as a distance from the position corresponding to the central region is increased, when viewed from the direction orthogonal to the end surfaces 2a and 2b.

As illustrated in FIG. 7, the other end of the connection conductor 17 is exposed at a position closer to the principal surface 2c than the central region of the end surface 2b when viewed from the direction orthogonal to the end surface 2b. In other words, when viewed from the direction orthogonal to the end surface 2b, the position where the other end of the connection conductor 17 is exposed at the end surface 2b and a position where the thickness of the second electrode layer 23 included in the electrode portion 5a is maximum are different.

As illustrated in FIG. 8, the other end of the connection conductor 18 is exposed at a position closer to the principal surface 2d than the central region of the end surface 2a when viewed from the direction orthogonal to the end surface 2a. In other words, when viewed from the direction orthogonal to the end surface 2a, a position where the other end of the connection conductor 18 is exposed at the end surface 2a and a position where the thickness of the second electrode layer 23 included in the electrode portion 4a is maximum are different.

When the multilayer coil component 1 is mounted in the electronic device, an external force acting on the multilayer coil component 1 from the electronic device acts as a stress force on the element body 2 through the external electrodes 4 and 5 in some cases. The stress force tends to concentrate on the first end 21e of the first electrode layer 21 included in the electrode portions 4b and 5b.

In the multilayer coil component 1, the thickness $T_{RS1}$ of the second electrode layer 23 positioned above the first end 21e of the first electrode layer 21 included in the electrode portions 4b and 5b is equal to or greater than 50% of the maximum thickness $T_{RSmax}$ of the second electrode layer 23 included in the electrode portions 4b and 5b. Therefore, in the case where an external force acts on the multilayer coil component 1, a stress force hardly concentrates on the first end 21e of the first electrode layer 21 included in the electrode portions 4b and 5b, and a crack is hardly caused from the first end 21e of the first electrode layer 21 included in the electrode portions 4b and 5b. Therefore, in the multilayer coil component 1, even if the thickness of the second electrode layer 23 is small, deterioration in a stress relaxation effect by the second electrode layer 23 is suppressed.

A ratio of the thickness $T_{RS1}$ with respect to the maximum thickness $T_{RSmax}$ and a ratio of the lengths $L_{SE1}$ and $L_{SE2}$ with respect to the lengths $L_{RS1}$ and $L_{RS2}$, which can suppress the deterioration in a stress relaxation effect will be described in detail.

Inventors of the present invention had the following tests to clarify a ratio of the thickness $T_{RS1}$ with respect to the maximum thickness $T_{RSmax}$ which can suppress the deterioration in a stress relaxation effect. First, a plurality of multilayer coil components (samples S1 to S5) having different ratios of the thickness $T_{RS1}$ with respect to the maximum thickness $T_{RSmax}$ is prepared, and a bending strength test is performed to each of the samples S1 to S5. After the bending strength test, the multilayer coil component is cut with a board to be described later, and it is visually confirmed whether a crack is generated in an element body of the multilayer coil component.

In the bending strength test, first, a multilayer coil component is solder-mounted on a center of the board (a glass epoxy board). A size of the board is 100 mm×40 mm, and a thickness of the board is 1.6 mm. Next, the board is placed on two bars parallely disposed at an interval of 90 mm. The board is placed in such a manner that a surface on which the multilayer coil component is mounted faces downward. Then, a bending stress force is applied at the center of the board from a back surface of the surface on which the multilayer coil component is mounted in such a manner that a bending amount of the board reaches a desired value.

A ratio of the thickness $T_{RS1}$ with respect to the maximum thickness $T_{RSmax}$ can be changed by changing the lengths $L_{SE1}$ and $L_{SE2}$. For example, if the first electrode layer 21 is formed in such a manner that the lengths $L_{SE1}$ and $L_{SE2}$ match the lengths $L_{RS1}$ and $L_{RS2}$, the thickness $T_{RS1}$ is coincident with the maximum thickness $T_{RSmax}$. In which case, the ratio of the thickness $T_{RS1}$ with respect to the maximum thickness $T_{RSmax}$ is 100%.

The samples S1 to S5 have the same configuration other than that ratios of the thickness $T_{RS1}$ with respect to the maximum thickness $T_{RSmax}$ (ratios of the lengths $L_{SE1}$ and $L_{SE2}$ with respect to the lengths $L_{RS1}$ and $L_{RS2}$) are different. In each of the samples S1 to S5, a length in the first direction D1 of the element body 2 is 1.46 mm, a length in the second direction D2 of the element body 2 is 0.75 mm, and a length in the third direction D3 of the element body 2 is 0.75 mm.

In the sample S1, a ratio of the thickness $T_{RS1}$ with respect to the maximum thickness $T_{RSmax}$ is "40%". A ratio of the lengths $L_{SE1}$ and $L_{SE2}$ with respect to the lengths $L_{RS1}$ and $L_{RS2}$ is "0.2". The maximum thickness $T_{RSmax}$ is 30 μm, and the thickness $T_{RS1}$ is 12 μm. The lengths $L_{RS1}$ and $L_{RS2}$ are 120 μm, and the lengths $L_{SE1}$ and $L_{SE2}$ are 24 μm.

In the sample S2, a ratio of the thickness $T_{RS1}$ with respect to the maximum thickness $T_{RSmax}$ is "50%". A ratio of the lengths $L_{SE1}$ and $L_{SE2}$ with respect to the lengths $L_{RS1}$ and $L_{RS2}$ is "0.6". The maximum thickness $T_{RSmax}$ is 30 μm, and the thickness $T_{RS1}$ is 15 μm. The lengths $L_{RS1}$ and $L_{RS2}$ are 120 μm, and the lengths $L_{SE1}$ and $L_{SE2}$ are 72 μm.

In the sample S3, a ratio of the thickness $T_{RS1}$ with respect to the maximum thickness $T_{RSmax}$ is "100%". A ratio of the lengths $L_{SE1}$ and $L_{SE2}$ with respect to the lengths $L_{RS1}$ and $L_{RS2}$ is "1.0". The maximum thickness $T_{RSmax}$ is 30 µm, and the thickness $T_{RS1}$ is 30 µm. The lengths $L_{RS1}$ and $L_{RS2}$ are 120 µm, and the lengths $L_{SE1}$ and $L_{SE2}$ are 120 µm.

In the sample S4, a ratio of the thickness $T_{RS1}$ with respect to the maximum thickness $T_{RSmax}$ is "50%". A ratio of the lengths $L_{SE1}$ and $L_{SE2}$ with respect to the lengths $L_{RS1}$ and $L_{RS2}$ is "1.6". The maximum thickness $T_{RSmax}$ is 30 µm, and the thickness $T_{RS1}$ is 15 µm. The lengths $L_{RS1}$ and $L_{RS2}$ are 120 µm, and the lengths $L_{SE1}$ and $L_{SE2}$ are 192 µm.

In the sample S5, a ratio of the thickness $T_{RS1}$ with respect to the maximum thickness $T_{RSmax}$ is "40%". A ratio of the lengths $L_{SE1}$ and $L_{SE2}$ with respect to the lengths $L_{RS1}$ and $L_{RS2}$ is "1.8". The maximum thickness $T_{RSmax}$ is 30 µm, and the thickness $T_{RS1}$ is 12 µm. The lengths $L_{RS1}$ and $L_{RS2}$ are 120 µm, and the lengths $L_{SE1}$ and $L_{SE2}$ are 216 µm.

When the bending stress force is applied on the board in such a manner that the bending amount of the board becomes "5.0 mm", cracks were confirmed on element bodies of the samples S1 and S5. In contrast, cracks were not confirmed on element bodies of the samples S2, S3, and S4.

When the bending stress force is applied on the board in such a manner that the bending amount of the board becomes "7.0 mm", cracks were confirmed on element bodies of the samples S1, S4, and S5. In contrast, cracks were not confirmed on element bodies of the samples S2 and S3.

As described above, when the ratio of the thickness $T_{RS1}$ with respect to the maximum thickness $T_{RSmax}$ is equal to or greater than 50%, the deterioration in the stress relaxation effect is suppressed. Further, when the ratio of the lengths $L_{SE1}$ and $L_{SE2}$ with respect to the lengths $L_{RS1}$ and $L_{RS2}$ is in the range of 0.6 to 1.0, the deterioration in the stress relaxation effect is further suppressed.

The first end 21e of the first electrode layer 21 included in the electrode portions 4b and 5b is positioned on the outer side of the coil 15 when viewed from the second direction D2. Consequently, even in the case where a stress force concentrates on the first end 21e of the first electrode layer 21 included in the electrode portions 4b and 5b, and a crack starting from the first end 21e is generated in the element body, the crack hardly reaches the coil 15. Therefore, even in the case where the crack is generated in the element body 2, the crack hardly affects the coil 15, and degradation of electrical characteristics of the multilayer coil component 1 is suppressed.

A stress force hardly concentrates on an end of the second electrode layer 23 included in the electrode portions 4b and 5b as compared with the first end 21e of the first electrode layer 21 included in the electrode portions 4b and 5b. Therefore, the end of the second electrode layer 23 included in the electrode portions 4b and 5b may overlap the coil 15 when viewed from the second direction D2.

The first electrode layer 21 includes a sintered metal layer. The sintered metal layer is a layer formed by sintering metal components (metal powders) included in a conductive paste. Therefore, the sintered metal layer is hardly formed as a uniform metal layer, and it is difficult to control a shape of the layer. The sintered metal layer, for example, has a shape (such as a mesh shape) including a plurality of openings (through holes).

The second electrode layer 23 is a layer on which metal powders are dispersed in a cured resin. A current path is formed in the second electrode layer 23 when the metal powders come into contact with each other. It is difficult to control the dispersion state of the metal powders in the resin and difficult to control a position of the current path in the second electrode layer 23.

Accordingly, current paths in the second electrode layer 23 and the first electrode layer 21 differ depending on products. In some products, for example, metal powders are formed in lines at a position where the thickness of the second electrode layer 23 included in the electrode portions 4a and 5a is maximum, and the metal powders and the first electrode layer 21 having a mesh shape come into contact with each other. In this product, when viewed from the first direction D1, if a position where the other ends of the connection conductors 17 and 18 are exposed at the end surfaces 2b and 2a is coincident with a position where a thickness of the second electrode layer 23 included in the electrode portions 4a and 5a is maximum, a DC resistance increases since a current flows into the other ends of the connection conductors 17 and 18 through a current path formed at the position where the thickness of the second electrode layer 23 included in the electrode portions 4a and 5a is maximum. To obtain a product with a low DC resistance, even if a current path is formed at the position where the thickness of the second electrode layer 23 included in the electrode portions 4a and 5a is maximum, a provability that a current flows in the current path should be reduced.

In the multilayer coil component 1, when viewed from the first direction D1, the position where the other ends of the connection conductors 17 and 18 are exposed at the end surfaces 2b and 2a differs from the position where the thickness of the second electrode layer 23 included in the electrode portions 4a and 5a is maximum. Therefore, it is highly possible that a current flows to the other ends of the connection conductors 17 and 18 through a current path formed at a position other than the positon where the thickness position of the second electrode layer 23 included in the electrode portions 4a and 5a is maximum. Therefore, according to the embodiment, it is difficult to obtain the multilayer coil component 1 with a high DC resistance. In other words, according to the embodiment, it is possible to lower a DC resistance of the multilayer coil component 1.

The first end 21e of the first electrode layer 21 included in the electrode portion 4b is positioned closer to the end surface 2a than the position where the thickness of the second electrode layer 23 included in the electrode portion 4b is the maximum thickness $T_{RSmax}$ when viewed from the second direction D2. In which case, as compared with the case where the first end 21e of the first electrode layer 21 included in the electrode portion 4b is positioned further away from the end surface 2a than a position where the thickness of the second electrode layer 23 included in the electrode portion 4b is the maximum thickness $T_{RSmax}$, the first end 21e of the first electrode layer 21 included in the electrode portion 4b is positioned away from the coil 15.

The first end 21e of the first electrode layer 21 included in the electrode portion 5b is positioned closer to the end surface 2b than the position where the thickness of the second electrode layer 23 included in the electrode portion 5b is the maximum thickness $T_{RSmax}$ when viewed from the second direction D2. In this case, as compared with the case where the first end 21e of the first electrode layer 21 included in the electrode portion 5b is positioned further away from the end surface 2b than a position where the thickness of the second electrode layer 23 included in the electrode portion 5b is the maximum thickness $T_{RSmax}$, the first end 21e of the first electrode layer 21 included in the electrode portion 5b is positioned away from the coil 15.

Since the first end 21e of the first electrode layer 21 included in the electrode portions 4b and 5b is positioned away from the coil 15, even in the case where a crack starting from the first end 21e of the first electrode layer 21 included in the electrode portions 4b and 5b is generated in the element body 2, the crack hardly reaches the coil 15. Therefore, even in the case where a crack is generated in the element body 2, the crack hardly affects the coil 15, and degradation of electrical characteristics of the multilayer coil component 1 is suppressed.

The various embodiments have been described. However, the present invention is not limited to the embodiments and various changes, modifications, and applications can be made without departing from the gist of the present invention.

In the embodiment, the external electrodes 4 and 5 include the electrode portions 4a and 5a, the electrode portions 4b and 5b, and the electrode portions 4c and 5c has been described. However, a shape of the external electrode is not limited thereto. For example, the external electrode 4 may be formed only on the end surface 2a and one principal surface 2c, and the external electrode 5 may be formed only on the end surface 2b and another principal surface 2c. In which case, the principal surface 2c is a mounting surface.

Even in the case where the thickness $T_{RS1}$ of the second electrode layer 23 positioned above the first end 21e of the first electrode layer 21 included in the electrode portions 4b and 5b is equal to or greater than 50% of the maximum thickness $T_{RSmax}$ of the second electrode layer 23 included in the electrode portions 4b and 5b, the lengths $L_{SE1}$ and $L_{SE2}$ may be equal to or longer than the lengths $L_{RS1}$ and $L_{RS2}$. From a viewpoint of suppressing the degradation of the electrical characteristics of the multilayer coil component 1, as described above, the lengths $L_{SE1}$ and $L_{SE2}$ may be shorter than the lengths $L_{RS1}$ and $L_{RS2}$.

The thickness $T_{RS1}$ may be less than 50% of the maximum thickness $T_{RSmax}$. From a viewpoint of suppressing the deterioration in the stress relaxation effect of the multilayer coil component 1, as described above, the thickness $T_{RS1}$ may be equal to or greater than 50% of the maximum thickness $T_{RSmax}$.

The first end 21e of the first electrode layer 21 included in the electrode portions 4b and 5b may overlap the coil 15 when viewed from the second direction D2. From a viewpoint of suppressing the degradation of the electrical characteristics of the multilayer coil component 1, as described above, the first end 21e of the first electrode layer 21 included in the electrode portions 4b and 5b may be positioned on the outer side of the coil 15 when viewed from the second direction D2.

When viewed from the first direction D1, a position where the other ends of the connection conductors 17 and 18 on the end surfaces 2a and 2b are exposed may overlap the position where the thickness of the second electrode layer 23 included in the electrode portions 4a and 5a is maximum. Since it is difficult to obtain the multilayer coil component 1 with a high DC resistance, as described above, when viewed from the first direction D1, the position where the other ends of the connection conductors 17 and 18 are exposed at the end surfaces 2b and 2a may differ from the position where the thickness of the second electrode layer 23 included in the electrode portions 4a and 5a is maximum.

What is claimed is:

1. A multilayer coil component, comprising:
   an element body;
   a coil disposed in the element body;
   an external electrode disposed on the element body;
   a connection conductor including one end connected to the coil and another end connected to the external electrode, the connection conductor being disposed in the element body,
   wherein the element body includes
      a principal surface that is a mounting surface; and
      an end surface positioned adjacent to the principal surface and extending in a direction crossing to the principal surface, and
   the external electrode includes
      an underlying metal layer formed on the principal surface and the end surface; and
      a conductive resin layer formed to cover the underlying metal layer,
   the other end of the connection conductor is exposed at the end surface and connected to the underlying metal layer, and
   when viewed from a direction orthogonal to the end surface, a position where the other end of the connection conductor is exposed at the end surface differs from a position where a thickness of a portion positioned above the end surface of the conductive resin layer is maximum.

2. The multilayer coil component according to claim 1, wherein an end positioned above the principal surface of the underlying metal layer is positioned on an outer side of the coil when viewed from the direction orthogonal to the principal surface.

3. The multilayer coil component according to claim 2, wherein the end of the underlying metal layer is positioned closer to the end surface than a position where a thickness of the portion positioned above the principal surface of the conductive resin layer is maximum, when viewed from the direction orthogonal to the principal surface.

* * * * *